United States Patent
Birnstock et al.

(10) Patent No.: US 7,256,541 B2
(45) Date of Patent: Aug. 14, 2007

(54) ORGANIC LIGHT-EMITTING DIODE (OLED) AND METHOD FOR THE PRODUCTION THEREOF

(75) Inventors: Jan Birnstock, Dresden (DE); Jörg Blässing, Oberkochen (DE); Karsten Heuser, Erlangen (DE); Marcus Scheffel, Gerlingen (DE); Matthias Stössel, Mannheim (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/500,434

(22) PCT Filed: Nov. 27, 2002

(86) PCT No.: PCT/DE02/04346

§ 371 (c)(1),
(2), (4) Date: Feb. 3, 2005

(87) PCT Pub. No.: WO03/061026

PCT Pub. Date: Jul. 24, 2003

(65) Prior Publication Data

US 2005/0122035 A1  Jun. 9, 2005

(30) Foreign Application Priority Data

Dec. 28, 2001 (DE) .................... 101 64 016

(51) Int. Cl.
*H01J 1/62* (2006.01)
*H01J 63/04* (2006.01)
*H01J 9/227* (2006.01)
*H01J 9/00* (2006.01)
*H01J 1/74* (2006.01)

(52) U.S. Cl. ............ 313/502; 313/503; 313/504; 445/24; 445/11; 445/12; 445/14

(58) Field of Classification Search ................ 313/504
See application file for complete search history.

(56) References Cited

U.S. PATENT DOCUMENTS 4,123,269 A * 10/1978 Von Hoene et al. .......... 430/60

(Continued)

FOREIGN PATENT DOCUMENTS

WO    WO98/17083    4/1998

(Continued)

OTHER PUBLICATIONS

S. Carter et al.: "Enhanced luminance in polymer composite light emitting devices" Appl. Phys. Letts., American Institute of Physics, New York, vol. 72, No. 9, pp. 1145-1147, Sep. 1, 1997.

(Continued)

*Primary Examiner*—Mariceli Santiago
*Assistant Examiner*—Elizabeth Rielley
(74) *Attorney, Agent, or Firm*—Cohen Pontani Lieberman & Pavane LLP

(57) ABSTRACT

An organic layer (1) is applied to a transparent carrier (2) in such a way that different partial regions with different refractive indices are formed in the layer. Owing to deflection at the phase boundaries within the layer, fewer photons remain trapped in the layer as a result of wave-guiding losses than in the case of homogeneous layers.

25 Claims, 2 Drawing Sheets

U.S. PATENT DOCUMENTS

| | | | |
|---|---|---|---|
| 6,133,691 A | * | 10/2000 | Nakayama et al. ......... 313/504 |
| 6,828,042 B2 | * | 12/2004 | Imanishi ..................... 428/690 |
| 2002/0064683 A1 | * | 5/2002 | Okada et al. ................ 428/690 |
| 2004/0155576 A1 | * | 8/2004 | Tyan et al. .................. 313/504 |
| 2005/0170075 A1 | * | 8/2005 | Chung .......................... 427/66 |
| 2005/0170737 A1 | * | 8/2005 | Seo et al. ...................... 445/24 |

FOREIGN PATENT DOCUMENTS

| | | | |
|---|---|---|---|
| WO | WO 00/04593 A | | 1/2000 |
| WO | WO0004593 | * | 1/2000 |

OTHER PUBLICATIONS

J.M. Lupton et al.: "Bragg scattering from periodically microstructured light emitting diodes", Appl. Phys. Lett., American Institute of Physics, vol. 77, No. 21, pp. 3340-3342, Nov. 20, 2000.

T. Yamasaki et al., "Organic light-emitting device with an ordered monolayer of silica microspheres as a scattering medium," Applied Physics Letters vol. 76, No. 10, pp. 1243-1245, Mar. 6, 2000.

* cited by examiner

--PRIOR ART--

33% PPV, 67% PVK

50% PPV, 50% PVK

ORGANIC LIGHT-EMITTING DIODE (OLED) AND METHOD FOR THE PRODUCTION THEREOF

RELATED APPLICATIONS

This is a U.S. national stage of International application No. PCT/DE02/04346 filed 27 Nov., 2002.

This patent application claims priority of German patent application no. 10164016.1 filed 28 Dec. 2001, the subject matter of which is hereby incorporated by reference.

FIELD OF THE INVENTION

The invention relates to an organic light emitting diode (OLED for short) with at least one polymer layer.

BACKGROUND OF THE INVENTION

Organic light emitting diodes exhibit a series of advantages which make them attractive for use in optoelectronics. These include the availability of many emission colors, low threshold voltages, fast switchability, small thickness and the possibility of using flexible substrates. Typical areas of application of OLEDs are pixelated display instruments and large-area elements for illumination purposes.

One important development goal for OLEDs is to increase the luminous efficiency and, associated with this, to reduce the power consumption. This is of importance particularly for portable electronic devices, in which only limited energy resources are available.

The majority of the previous developments for maximizing the luminous efficiency have been concerned with increasing the internal quantum efficiency. The latter is defined as the ratio between the photons generated in the diode to the injected electrons. New materials with improved luminescence properties, optimized layer sequences or better adapted electrode materials have contributed to increasing the internal quantum efficiency in recent years.

A different approach for increasing the luminous efficiency consists in improving the extraction efficiency. Extraction efficiency is understood as the probability with which a photon generated in the emission zone can be coupled out of the diode and thus ejected. Coupling-out losses arise as a result of absorption or as a result of waveguidance in one of the layers. Waveguidance is caused by total reflection at the interface of two layers with different refractive indexes. In the case of planar interfaces, the angle between incident and reflected beam does not change apart from the sign. Accordingly, once a photon has been subjected to total reflection, it remains confined in the corresponding layer and cannot be extracted.

The representation of FIG. 1 illustrates the process of waveguidance in the layers of an organic light emitting diode:

A transparent electrode 2 (generally indium tin oxide, ITO for short) is situated on a substrate 3. At least one organic layer 1 is deposited on said electrode, said layer being followed by an electrode 5 (e.g. a cathode). Photons are generated by emitters 6 in the organic layer 1. Only photons which do not remain in one of the layers 1–3 and 5 as a result of waveguidance are extracted. The line IV shows the path of an extracted photon by way of example.

Depending on the layer thickness and refractive index of the individual layers, wave-guiding effects, indicated by the lines I, II and III in FIG. 1, may occur in the organic layer, in the transparent electrode and in the substrate, respectively. Since the layer thicknesses of the organic layers and of the transparent electrode are in the region of the light wavelength or less than that, discrete optical modes I, II, corresponding respectively to lines I, II mentioned above, form in these layers, as a single stationary optical wave with a distinct wavelength. A continuum of modes III, corresponding to line III mentioned above, is present in the substrate as a plurality of optical waves with different wavelengths, and traditional geometric optics can be used to calculate and predict the behavior of the continuum of modes. Therefore, a distinction is made between layer modes and substrate modes.

If the formation of layer modes can be disturbed and the undesirable waveguidance can thus be minimized, the extraction efficiency is increased and so, too, is the luminous efficiency.

The optical modes formed in a thin planar layer are dependent not only on the wavelength but essentially on the layer thickness and the refractive index of the layer.

A change in the refractive index and thus the disturbance of the wave-guiding effects can be achieved by means of inhomogeneities in the organic layer if the inhomogeneities have a different refractive index than the layer matrix.

To date, the approaches a) to c) briefly outlined below have been proposed for suppressing wave-guiding effects, in which case a) and b) aim at changing the refractive index and c) utilizes a change in the layer thickness:

a) Dispersion of nanoparticles in one of the organic layers of the OLED (S. A. Carter et al., Enhanced luminance in polymer composite light emitting devices, Appl. Phys. Lett. 71(9), p. 1145, 1997)

In this case, particles of $TiO_2$, $SiO_2$ or $Al_2O_3$ having a size of 30 to 80 nm are embedded in the polymeric emitter material MEH-PPV.

This method is associated with the following difficulties:

It is technically very difficult to disperse nanoparticles uniformly in a solvent in which polymers have already been dispersed or dissolved. The consequence of poorly dispersed nanoparticles is an inhomogeneous emission of the LED layer which contains said nanoparticles, for which reason diodes produced in such a way are not suitable for use in display instruments.

The oxidic nanoparticles proposed can lead to a degradation of the active layer through oxidation. Accordingly, a significantly shorter service life has been observed in the case of the diodes with nanoparticles than in the case of the reference diodes.

b) Densely packed $SiO_2$ microspheres (T. Yamasaki, K. Sumioka, T. Tsutsui: Organic light-emitting device with an ordered monolayer of silica microspheres as a scattering medium, Appl. Phys. Lett. 76(10), p. 1243, 2000).

In this case, monolayers of densely packed $SiO_2$ spheres with a diameter of 550 nm are used as scattering centers. In this case, the spheres are applied on the substrate beside the ITO anode tracks. This makes it possible to suppress waveguidance in the organic layers and in the glass. An increase in the coupling-out efficiency was observed.

This method is associated with the following difficulties:

The application of densely packed sphere areas can be realized only with a very high effort. Moreover, a large-area application of such areas of several square centimeters has not yet been realized hitherto. The scattering centers are situated outside the active diode volume. Accordingly, only a small part of the substrate surface can be utilized for light generation. Furthermore, an inhomogeneous luminance results.

The periodic structure of the dense sphere packing means that the scattering efficiency is highly wavelength-selective. Accordingly, a generally undesirable lateral color profile occurs.

c) Corrugated (wave-shaped) organic layers (J. M. Lupton et al., Bragg scattering from periodically microstructured light emitting diodes, Appl. Phys. Lett. 77(21), p. 3340, 2000).

In this case, a polymeric LED is applied on a one-dimensional periodic structure with a period of 388 nm and depths of 10–100 nm. The structure acts as a Bragg reflector and again leads to scattering of optical modes in the emitter material.

This method is associated with the following difficulties:

The periodicity of the structure leads to a high degree of angular dispersion. A 15 nm thin gold layer was used as the anode, said gold layer already having a high degree of absorption despite the small layer thickness. Transferring the corrugation to the transparent ITO that is otherwise customary as a standard anode is difficult to realize on account of the larger ITO layer thicknesses and high process temperatures.

Furthermore, there are diverse approaches for better coupling-out of the substrate modes. However, since these methods cannot prevent the formation of optical modes in thin layers, they are not taken into consideration for preventing the wave-guiding effect.

SUMMARY OF THE INVENTION

One object of the present invention is to provide an organic active OLED layer and a method for producing it in which particular precautions are taken to minimize the wave-guiding effect without the service life of the layer being severely shortened as a result of the use of organic materials.

This and other objects are attained in accordance with one aspect of the present invention directed to an organic light emitting diode (OLED) with at least one organic layer which has refractive index inhomogeneities, wherein the organic layer has at least one first partial region and at least one second partial region which comprise organic material and have different refractive indices, and the partial regions form a layer with a composite-like structure.

Another aspect of the present invention is directed to a method for producing an organic light emitting diode (OLED) with at least one organic layer which has refractive index inhomogeneities wherein the material of the organic layer is applied to a carrier in such a way that, during or after the coating step, at least one first partial region and at least one second partial region form in the layer. The partial regions have different refractive indices, and the partial regions form a layer with composite-like structure.

According to an aspect of the invention, inhomogeneities are introduced in at least one organic layer of the OLED, said inhomogeneities themselves having an organic composition. The organic inhomogeneities have a different refractive index than a layer matrix and consequently disturb the wave-guiding effects.

FIG. 2A uses the line 4a provided with arrows to diagrammatically show the path of a photon which is emitted by an emitter 6 and extracted from an organic layer 1 when, after passing through partial regions 1B having a first refractive index within a layer matrix material 1A having a second refractive index, different from the first, it impinges on a transparent adjacent layer 2, which is an ITO anode, for example, at a steeper angle than the critical angle of total reflection. Layer 5 is a cathode, for example.

For comparison, FIG. 2B uses the line 4b provided with arrows to diagrammatically show the path of a photon which is generated in a homogeneous organic layer composed entirely of a single material. Between a cathode 5 and a transparent anode 2, a photon remains trapped in the layer as a result of the wave-guiding effect if the angle of impingement does not exceed the critical angle of total reflection. Layer modes are produced.

In order to produce an organic layer with partial regions with different refractive indices, use is made of a mixture of plastics, the properties of which permit utilization as an active OLED layer or else as a passive intermediate layer, or a mixture of its starting materials. Separation processes during or after layer formation are utilized in a targeted manner in order to obtain a layer containing two or more phases in this case. In a particular preferred variant, the phases with a different refractive index comprise different plastics.

In order that the refractive index inhomogeneities contribute particularly effectively to the extraction of the photons from the transparent layer, it is advantageous that a composite-like structure forms as a result of the separation in the layer. In this case, composite-like structure is understood as principally the structure of a particle-filled plastic, and also the structure of a composite with two three-dimensionally interpenetrating individual components, as is also produced for example when an open-pored plastic body is filled with a second plastic.

In order to obtain a layer having at least two phases, at least two polymers are dissolved or dispersed, which separate during the removal of the solvent or dispersant or already separate before the drying of the layer as a result of separation of the solvents or dispersants.

Instead of working with substances that have already been polymerized, it is conceivable to use monomeric or oligomeric starting materials of the polymers for coating, in which case the separation of the at least two phases may occur before, during or after polymerization.

In another preferred variant, the layer is composed chemically of a single polymeric material which has, in island regions with respect to the matrix, differences in material properties such as crystallinity, degree of branching, degree of crosslinking, density and copolymerization, and thus differences in refractive index.

Different charge carrier transport materials, emitter materials and arbitrary mixtures thereof may be used as plastics. It is also possible to use further, electrically inactive plastics or their precursors.

By varying the production conditions, separation process and chemical reactions and thus the structure and the optical properties of the plastic layer can be influenced in a targeted manner.

DETAILED DESCRIPTION OF THE DRAWINGS

Figure 1:
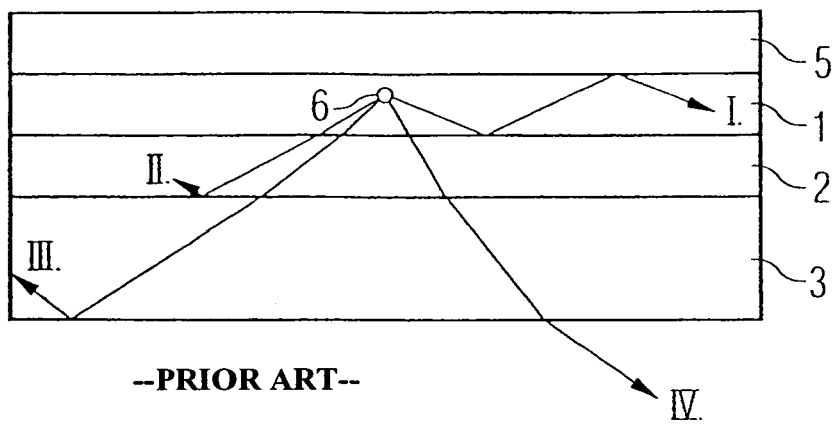
FIG. 1 shows a diagrammatic illustration of the waveguidance losses in the layers of a conventional organic light emitting diode.
Figure 2A:
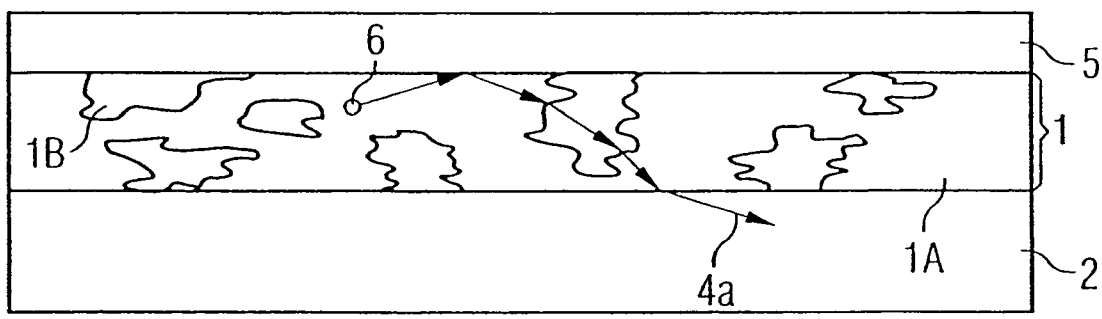
FIG. 2A shows a diagrammatic illustration of the scattering of photons by refractive index inhomogeneities in an organic layer.
Figure 2B:
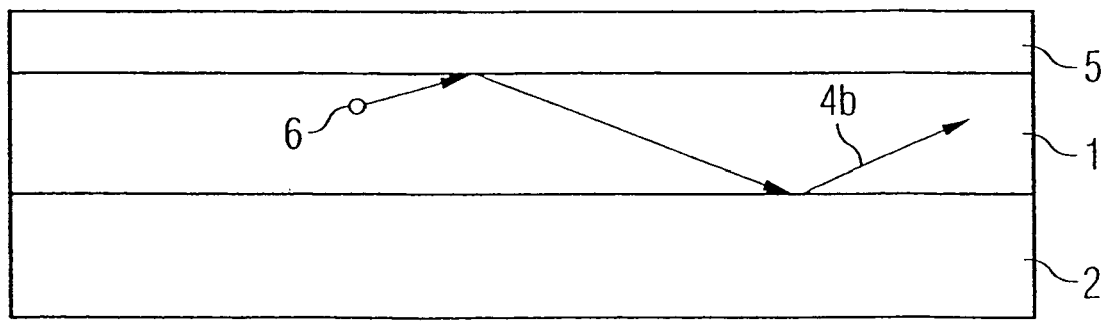
FIG. 2B shows a diagrammatic illustration of the waveguidance in an organic layer without scattering centers.

The explanations concerning FIGS. 1–2B are already given in the general part of the description.

Figure 3A:
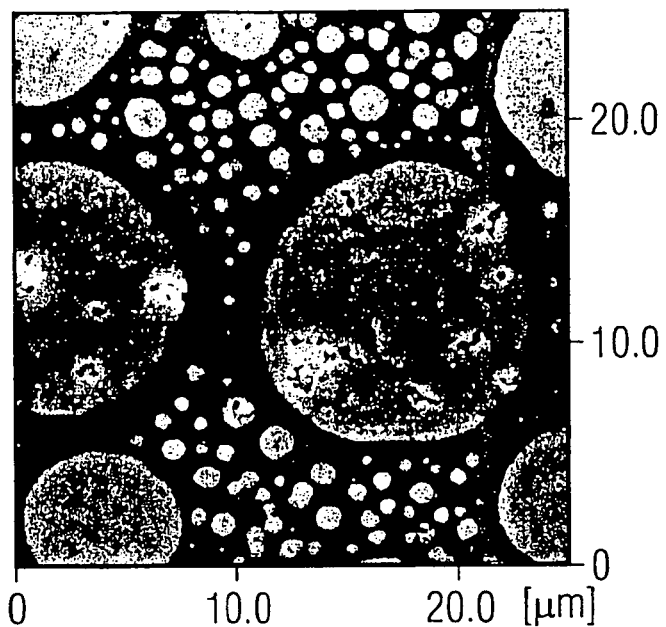
FIG. 3A shows a micrograph of an organic layer in accordance with a first exemplary embodiment of the invention.

Exemplary Embodiment 1 (FIG. 3A)

This involves the polymer materials poly(paraphenylene-vinylene) derivative (PPV) and poly(N-vinylcarbazole) (PVK), which were mixed and spun-on in solution as a layer on a substrate.

The mixture of the dissolved plastics comprised one third PPV and two thirds PVK. After the spinning-on, a separation of the two materials occurred, in the course of which large structures made of PVK formed with small satellites in a PPV matrix. This is shown in the micrograph of the surface of the organic layer produced, as shown in FIG. 3A. PVK regions with a broad size distribution curve are incorporated as scattering centers in a matrix made of PPV.

Figure 3B:
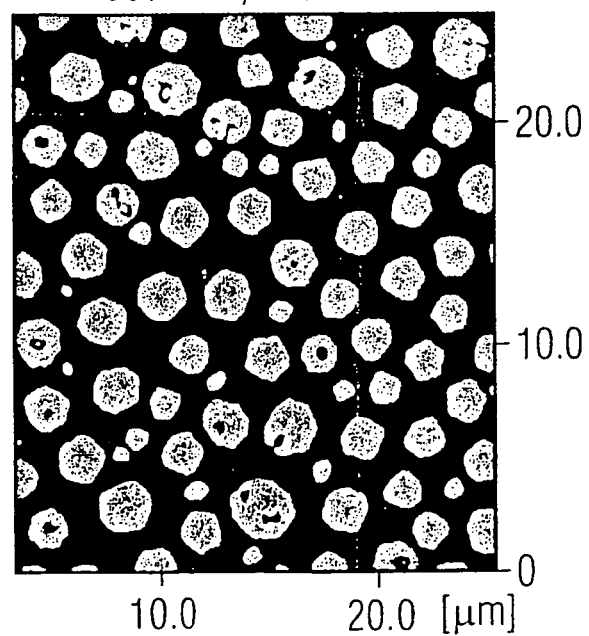
FIG. 3B shows a micrograph of an organic layer in accordance with a second exemplary embodiment of the invention.

Exemplary Embodiment 2 (FIG. 3B)

As in exemplary embodiment 1, this involves PPV and PVK which were mixed and spun on in solution as a layer.

In this example, the mixture comprises 50% PPV and 50% PVK. The micrograph of the organic layer produced in this case, illustrated in FIG. 3B, shows that spherical PVK regions are again incorporated as scattering centers in a PPV matrix, but in this case with a very much narrower size distribution curve than in the first exemplary embodiment explained above.

In both the micrographs, the light areas are composed of PVK and the dark areas are composed of PPV.

The exemplary embodiments verify how a different size and a different size distribution of the scattering centers can be obtained by varying the mixture ratios of the two plastics. This advantageously affords the possibility of setting the optical properties of the organic layer in a targeted manner.

It goes without saying that the present invention is not restricted to the polymer materials mentioned in the two exemplary embodiments, but rather can be applied to all materials suitable in terms of their electrical properties for organic LEDs.

Furthermore, with a single plastics material, for example, it is possible to obtain a similar effect to a separation if crystalline regions form within an amorphous matrix.

The scope of protection of the invention is not limited to the examples given hereinabove. The invention is embodied in each novel characteristic and each combination of characteristics, which includes every combination of features which are stated in the claims, even if this combination of features is not explicitly stated in the claim.

The invention claimed is:

1. An organic light emitting diode (OLED) with at least one active, light emitting organic layer which has refractive index inhomogeneities;
wherein the organic layer has at least one first partial region with a first refractive index and a plurality of second partial regions with a second refractive index which is different from the first refractive index, said second partial regions forming irregularly arranged refractive index inhomogeneities in the organic layer.

2. The OLED as claimed in claim 1, wherein the different partial regions are formed by separation of the applied layer material.

3. The OLED as claimed in claim 1, wherein the organic layer has charge carrier transport material and/or emitter material.

4. The OLED as claimed in claim 1, wherein the organic layer has electrically inactive material.

5. The OLED as claimed in claim 1, wherein the organic layer has at least two polymers with different refractive indices.

6. The OLED as claimed in claim 1, wherein the first and second partial regions are produced in a layer made from a single type of a plastics material by means of local variation of a chemical and/or physical property.

7. The OLED as claimed in claim 6, wherein the layer made from a single type of plastic material is an amorphous layer, said amorphous layer forming the first partial region and second partial regions are crystalline regions within said amorphous layer.

8. The OLED as claimed in claim 6, wherein the locally varying property is at least one of the properties degree of crosslinking, degree of branching density and copolymerization.

9. A method for producing an organic light emitting diode (OLED) with at least one active, light emitting organic layer which has refractive index inhomogeneities;
wherein the material of the organic layer is applied to a carrier in such a way that, during or after a coating step, at least one first partial region with a first refractive index and a plurality of second partial regions with a second refractive index form in the layer, said second refractive index of the second partial regions being different from the first refractive index, and said second partial regions forming irregularly arranged refractive index inhomogeneities in the organic layer.

10. The method as claimed in claim 9, wherein the partial regions are formed by a separation process in a forming polymer layer from a mixture of soluble or dispersible polymers or monomers, in which at least two phases are produced.

11. The method as claimed in claim 10, wherein the separation of the polymers is brought about by the removal of a solvent or a dispersant.

12. The method as claimed in claim 10, wherein the separation of the polymers is caused by a separation of at least two solvents in which the at least two polymers are dissolved.

13. The method as claimed in claim 10, wherein the separation of the polymers is caused by a separation of at least two dispersants in which the at least two polymers are dispersed.

14. The method as claimed in claim 10, wherein the at least two different polymers are formed in the organic layer only during the coating method or thereafter by polymerization.

15. The method as claimed in claim 9, wherein charge carrier transport material and/or emitter material is used for the organic layer.

16. The method as claimed in claim 9, wherein electrically inactive material is used for the organic layer.

17. An organic light-emitting diode (OLED) with at least one active, light-emitting layer which has refractive index inhomogeneities;

wherein the organic layer has at least one first partial region with a first refractive index and a plurality of second partial regions with second refractive index which is different from the first refractive index, said second partial regions having different sizes and forming refractive index inhomogeneities in the organic layer.

18. The OLED as claimed in claim 17, wherein the first partial region is formed by a first matrix material and the plurality of second partial regions are formed by a second material.

19. The OLED as claimed in claim 18, wherein the matrix material is an active, light-emitting material and the regions of the second material form scattering centers in the matrix material.

20. The OLED as claimed in claim 19, wherein the matrix material is PPV.

21. The OLED as claimed in claim 19, wherein the second material is PVK.

22. The OLED as claimed in claim 18, wherein the active light-emitting layer comprises one-third PPV and two-thirds PVK.

23. The OLED as claimed in claim 18, wherein the active, light-emitting layer comprises one half PPV and one half PVK.

24. The OLED as claimed in claim 18, wherein the regions of the second material are sphere shaped.

25. The OLED as claimed in claim 18, wherein at least one region of the second material is completely surrounded by the matrix material.

* * * * *